United States Patent [19]
Raad

[11] Patent Number: 5,400,283
[45] Date of Patent: Mar. 21, 1995

[54] RAM ROW DECODE CIRCUITRY THAT UTILIZES A PRECHARGE CIRCUIT THAT IS DEACTIVATED BY A FEEDBACK FROM AN ACTIVATED WORD LINE DRIVER

[75] Inventor: George B. Raad, Boise, Id.

[73] Assignee: Micron Semiconductor, Inc., Boise, Id.

[21] Appl. No.: 166,585

[22] Filed: Dec. 13, 1993

[51] Int. Cl.⁶ .......................... G11C 8/00; G11C 7/00
[52] U.S. Cl. .................... 365/203; 365/230.06; 365/230.01; 365/230.03; 365/189.11; 326/106
[58] Field of Search .......... 365/230.06, 203, 230.01, 365/189.11, 204, 230.03, 230.08; 307/463, 449

[56] References Cited

U.S. PATENT DOCUMENTS

| | | | |
|---|---|---|---|
| 4,897,568 | 1/1990 | Chern et al. | 307/530 |
| 5,132,575 | 7/1992 | Chern | 307/530 |
| 5,206,551 | 4/1993 | Chern | 307/530 |
| 5,245,578 | 9/1993 | McLaury | 365/203 |
| 5,293,342 | 3/1994 | Casper et al. | 365/203 |
| 5,302,870 | 4/1994 | Chern | 307/530 |
| 5,311,481 | 5/1994 | Casper et al. | 365/230.06 |

FOREIGN PATENT DOCUMENTS 0285793  11/1988  Japan ............... 365/230.06

*Primary Examiner*—Joseph A. Popek
*Assistant Examiner*—Huan Hoang
*Attorney, Agent, or Firm*—Susan B. Collier

[57] ABSTRACT

There is a precharge circuitry that uses little real estate and can be deactivated once a word line driver is activated. Specifically, a high signal created by the selected driver is fed back to the precharge circuit to deactivate it when activating a chosen word line. Thus, alleviating the resulting effect between the low signal to activate the selected driver and the precharge high voltage current both using the same node coupled to the word line drivers.

2 Claims, 3 Drawing Sheets

RAM ROW DECODE CIRCUITRY THAT UTILIZES A PRECHARGE CIRCUIT THAT IS DEACTIVATED BY A FEEDBACK FROM AN ACTIVATED WORD LINE DRIVER

FIELD OF THE INVENTION

The present invention relates to integrated circuits (ICs). Particularly, there is a circuit for decoding rows of a RAM. Uniquely, there is a high voltage precharge circuit that maintains a low or zero voltage level on the associated group of word lines. Additionally, once one of the drivers is decoded to be activated the high voltage output to the associated word line is also fed back to the precharge circuit to disable it.

BACKGROUND OF THE INVENTION

Row decodes are well-known in the art of memory devices. Typically these are a read and write memory device. Application programs that require storage space for variables and buffers can write data into RAM locations. The RAM date is addressed by direct reference rather than by a serial search of files or words. Previous decoding systems pass a high voltage through the decoding to select which row is to be accessed or turned on. Using a high voltage is slower than using a low voltage. Additionally, the high voltage decreases because of voltage threshold losses from passing through each transistor used to decode the chosen row. This voltage loss was not a problem when memory devices had 5 or more volts to run the device. However, with current trends have led to 3.3 and even lower voltages to start with. Thus, creating the potential to degrade the signal to a point of insignificance.

Thus, the new low power RAM devices have used a low or zero voltage signal to pass through the tree decoder to activate the word line drivers.

PROBLEMS

As a result of the low voltages used to activate the drivers, there needs to be a precharge circuit to keep a low current and high voltage on the drivers during inactivation times, or times when the drivers are not pulling up the voltage on a particular word line.

Therefore, a need exists to have a precharge circuitry that uses little real estate and can be deactivated once a word line driver is activated by a low signal entering the overall decode circuitry.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of a precharge circuitry that uses little real estate and can be deactivated once a word line driver is activated by being addressed.

Specifically, a high signal created by the selected driver is fed back to the precharge circuit to deactivate it when activating a chosen word line. Thus, alleviating the resulting effect between the low signal to activate the selected driver and the precharge high voltage current which both are using the same node coupled to the word line drivers.

Other features and advantages of the present invention may become more clear from the following detailed description of the invention, taken in conjunction with the accompanying drawings and claims, or may be learned by the practice of the invention.

Figure 1:
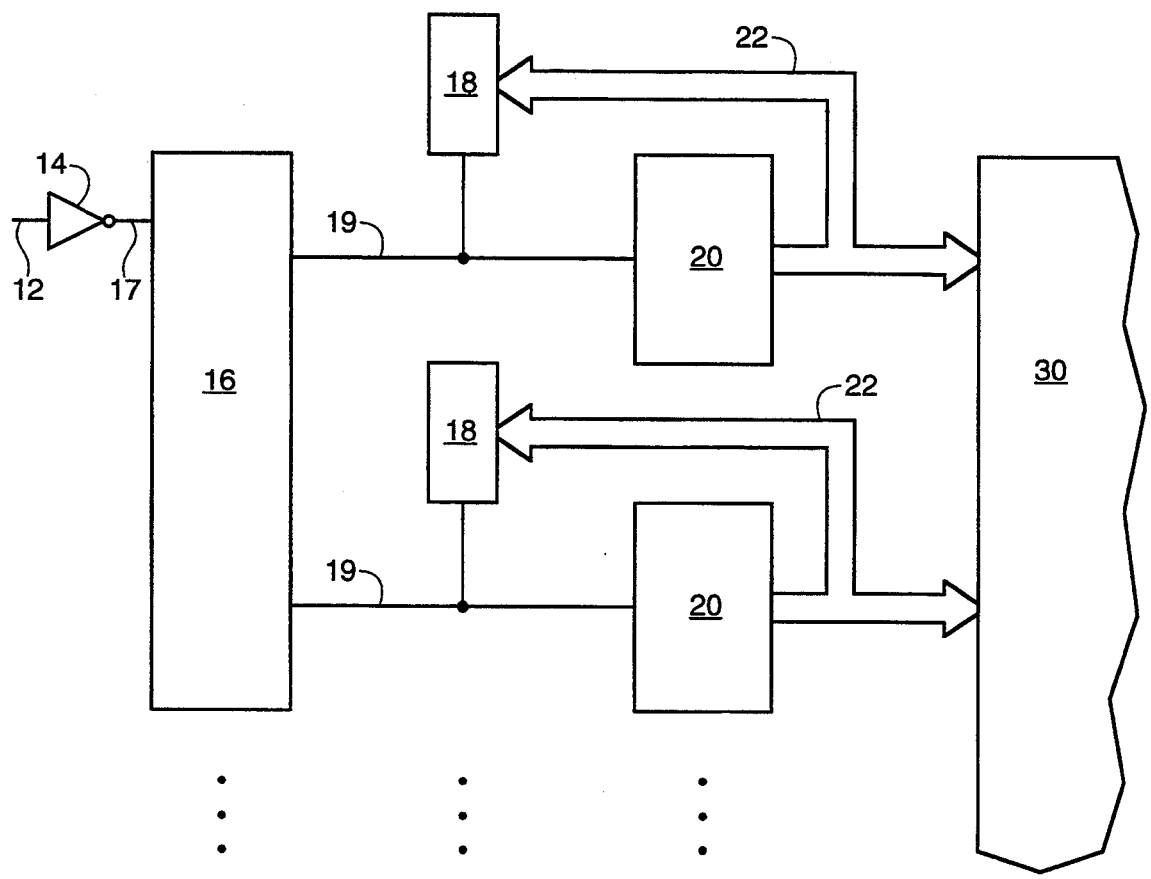
FIG. 1 is a block diagram of the interrelationship of the major parts of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

GENERAL EMBODIMENT

Uniquely, a whole packet of decode signals are sent to a memory device to select the specific row in the memory array. The whole memory device will receive 1) a first set of signals designating the section of the array containing the specific selected row; 2) a second set of signals is sent to the memory device that selects one of the many tree decodes to be activated in that section; 3) a third set of decode signals to the memory device will activate the specific word line driver circuit which in turn charges the row or word line to a digital one thus enabling the gates on that word line to be opened and thus dump out the signal of the particular memory cells chosen on that word line.

FIG. 1 is a block diagram of the interrelationship of the major parts of the invention, having the following elements: Input node 12 electrically coupled to a single section of the memory array 30. Inverter 14, outputs to node 17 which is coupled to at least one tree decode 16. Node 19 is coupled to the output of tree decode 16, precharge circuitry 18 and word line driver block 20. When a word line, roughly illustrated by multiple line element 22 is selected to be pulled high by the driver, there is a feedback to the precharge circuit 18. Feedback from the word lines will turn off the precharge circuitry.

Figure 2:
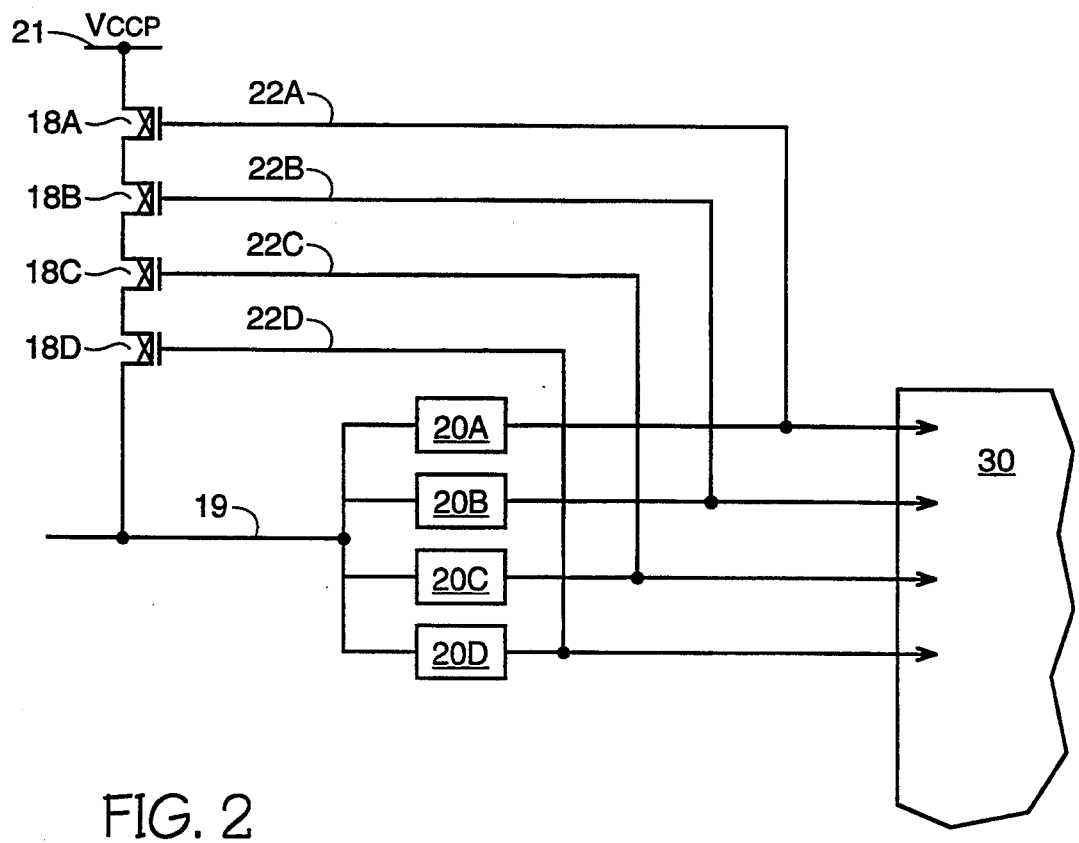
FIG. 2 is a detailed schematic of the pull up circuit and word line driver circuit interrelation.

FIG. 2 is a detailed schematic of the pull up circuit and word line driver circuit interrelation, having the following additional elements: P-channel transistors 18 A-D are in series with 1) a first end connected to node 21 having Vcc, or the power supply voltage, on it, and 2) a second end coupled to node 19. The gates of these transistors are connected to nodes 22 A-D respectively which are electrically coupled to the word line drivers 20 A-D respectively. Thus, when a particular word line is selected to be driven high, the feed back will shut down the appropriate precharge transistor, stopping the precharge of node 19 from node 21 having the power supply voltage Vcc. In an alternate embodiment, $V_{cc}$ on node 21 is a pumped potential, $V_{ccp}$. Pumped potentials are well known to those skilled in the art.

Figure 3:
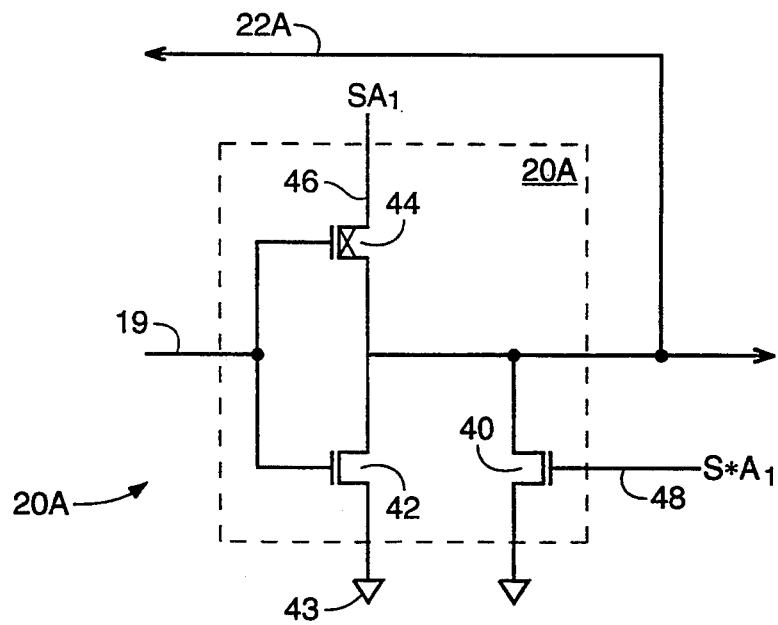
FIG. 3 is a detailed illustration of a single word line driver.

FIG. 3 is a detailed illustration of a single word line driver, having the following additional elements: Transistors 44 and 42 forming an inverter with node 19, signal to word driver A, called SA and being coupled to Vcc power supply, and ground 43. The output from the inverter goes to the word line node 22A. Transistor 40 coupled between node 22A and ground with the gate coupled to node 48 receiving the inverse of the signal on node 46, being S*A. In the alternate embodiment SA is coupled to Vccp or ground.

Figure 4:
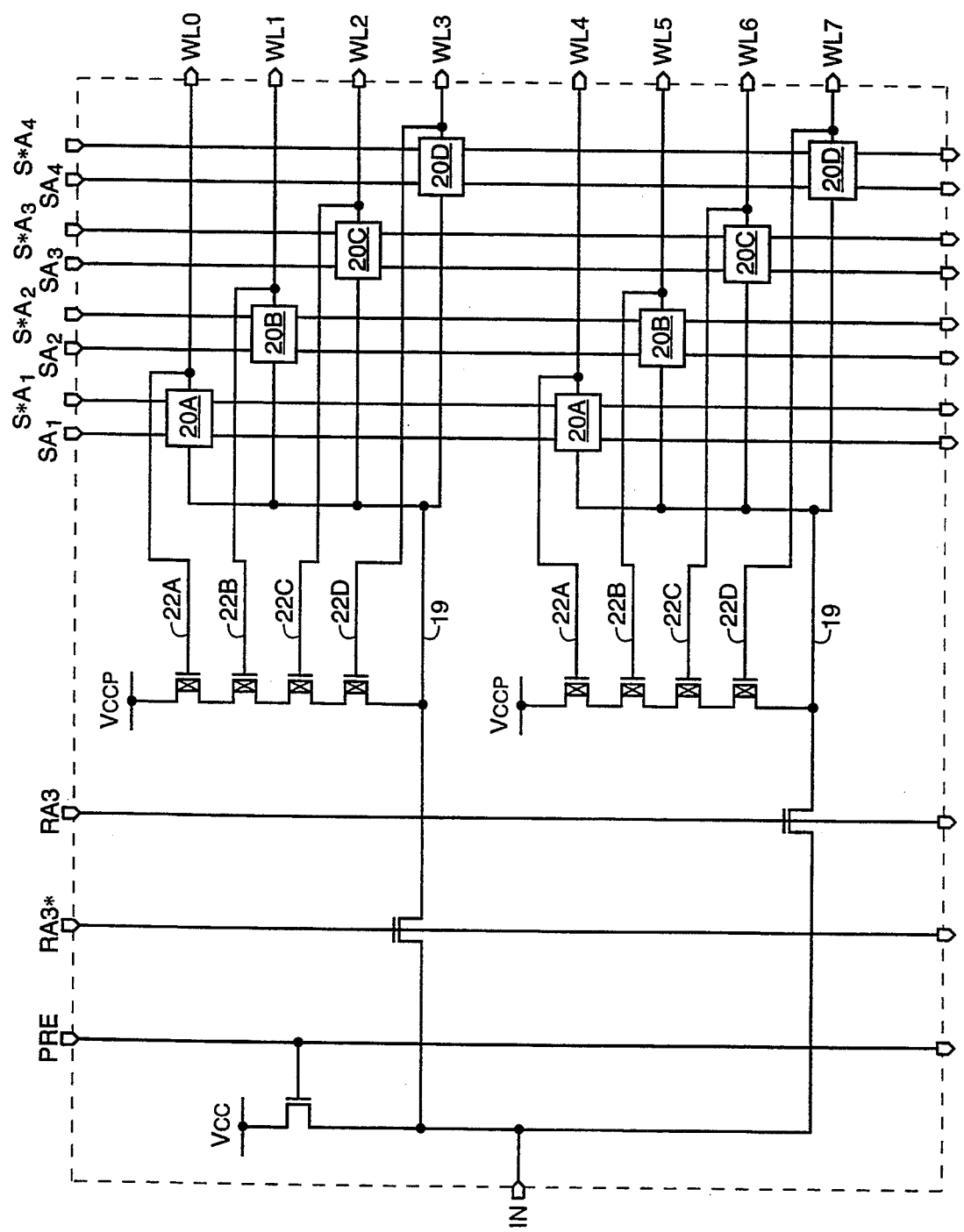
FIG. 4 is a single embodiment of the invention.

FIG. 4 is a single embodiment of the invention, having the additional wording as follows: WL (word line) zero to seven, and associated word line drivers. Signals SA1, S*A1, SA2, S*A2, SA3, S*A3, SA4, and S*A4 will select which word line driver will be activated. The two signals RA3* and RA3 in the tree decode will activate the selected the word line drivers.

REMARKS ABOUT THE INVENTION

It is noted that, a skilled artisan will be very familiar with the operation of decoding circuitry for random access memories.

It is further noted that, this invention allows for a zero or low voltage signal pass through the tree decode and to cause a word line driver to pull up a chosen word line. Typically, a high signal has been sent through the tree decode and used to pull up the word line. However, with the new requirements for low power computers, like lap tops and the such, power supplies (batteries) must be conserved to extend the life between recharging sessions. This has led to the solution of using zero voltage signals to pass through tree decodes. This solution has avoided the prior voltage threshold voltage loss problems. Specifically, if you started with 3.3 volts to go through the tree decode, each transistor the signal passes through would lower the voltage from gate threshold losses, creating compromising signal degradation. But if zero volts are passed through an N-channel transistor tree decoder, there is no loss of signal integrity.

Another feature of the invention is that the word line signal (high or low) is also fed back to the precharge circuit. If the word line is pulled high by the word line driver the precharge circuit is turned off via the high signal electrically coupled to the gate of a pull up P-channel transistor on the precharge circuit. And just the opposite occurs when the word line driver is pulled low by the driver, the associated transistor in the precharge circuit is left on. However, it only takes one of the four drivers to be activated to ultimately deactivate the precharge circuitry.

Another feature of the invention is that there are four word line drivers per tree decode, and one precharge circuit. Thus any time one of the word line drivers is to be activated (to a ones level, or addressed) the precharge circuit is shut down. Therefore, enabling the word line decoder to receive a full zero or low signal and not fight the precharge circuit.

It is noted that the four devices making up the precharge circuit are small devices, providing a small current of the high voltage to the drivers. Just enough to keep the driver outputs on a low voltage.

Similarly, it is noted, that the low voltage signal directed through the tree decode has a stronger current and therefore will over power the pull up circuit signal enough to activate the addressed word line driver.

Finally, the simplicity of the precharge circuitry and the associated control of the feed back signal should be noted. As a result there is little real estate used on the chip for this circuitry.

VARIATIONS IN THE INVENTION

There are several obvious variations to the broad invention and thus come within the scope of the present invention. Uniquely, this invention may work with any form known word line drivers. Additionally, although there are four matched sets of drivers to pull up circuit transistors, other numbers are feasible. Additionally, any number of tree decode transistors can be used in selecting which tree of the many to activate. Although, several nodes have been elevated to Vcc (power supply voltage level) the invention could have some of these nodes pumped above Vcc.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A memory device for storing data in an array of memory cells, the array having at least a first portion and a second portion, comprising:
   a) a first plurality of wordlines in electrical communication with the first portion of said array;
   b) a first plurality of first driver circuits, each of said first driver circuits having an input node and an output node, each of said first driver circuits in electrical communication, at its output node, with one of said wordlines, the input nodes of said first driver circuits connected at a first common node, a potential on said first common node enabling said first plurality of driver circuits to drive a select potential to a selected wordline and enabling said first plurality of driver circuits to drive a non select potential to non selected wordlines when all of said wordlines of said first plurality of wordlines are non selected;
   c) a first plurality of first serially connected transistors, each one of said first serially connected transistors connected, at a control input, to the output node of a corresponding one of said first driver circuits, said first plurality of said first serially connected transistors interposed between a first supply node, connectable to a first supply potential, and the first common node;
   d) a first decode means electrically interposed between a second supply node, connectable to a second supply potential, and said first common node, wherein said second supply potential is pumped to create said first supply potential, said first decode means allowing said potential of said first common node to be pulled toward said first supply potential when all of said wordlines of said first plurality of wordlines are non selected, said first decode means allowing said potential of said first common node to attain a potential different than said first supply potential when at least one of said first plurality of said wordlines is selected;

e) a second plurality of wordlines in electrical communication with the second portion of said array;

f) a second plurality of second driver circuits, each of said second driver circuits having an input node and an output node, each of said second driver circuits in electrical communication, at its output node, with one of said wordlines of said second plurality of wordlines, the input nodes of said second driver circuits connected at a second common node, a potential on said second common node enabling said second plurality of driver circuits to drive a select potential to a selected wordline in said second plurality of wordlines and enabling said second plurality of driver circuits to drive a non select potential to non selected wordlines in said second plurality of wordlines when all of said wordlines of said second plurality of wordlines are non selected;

g) a second plurality of second serially connected transistors, each one of said second serially connected transistors connected, at a control input, to the output node of a corresponding one of said second driver circuits, said second plurality of second serially connected transistors interposed between said first supply node and the second common node; and h) a second decode means electrically interposed between said second supply node and said second common node, said second decode means allowing said potential of said second common node to be pulled toward said first supply potential when all of said wordlines in said second plurality of wordlines are non selected, said second decode means allowing said potential of said second common node to attain a potential different than said first supply potential when at least one of said wordlines in said second plurality of said wordlines is selected.

2. A memory device for storing data in an array of memory cells, the array having at least a first portion and a second portion, comprising:

a) a first plurality of wordlines in electrical communication with the first portion of said array;

b) a first plurality of first driver circuits, each of said first driver circuits having an input node and an output node, each of said first driver circuits in electrical communication, at its output node, with one of said wordlines, the input nodes of said first driver circuits connected at a first common node, a potential on said first common node enabling said first plurality of driver circuits to drive a select potential to a selected wordline and enabling said first plurality of driver circuits to drive a non select potential to non selected wordlines when all of said wordlines of said first plurality of wordlines are non selected:

c) a first plurality of first serially connected transistors, each one of said first serially connected transistors connected, at a control input, to the output node of a corresponding one of said first driver circuits, said first plurality of said first serially connected transistors interposed between a first supply node, connectable to a first supply potential, and the first common node;

d) a first decode means electrically interposed between a second supply node, connectable to a second supply potential, and said first common node, said first decode means allowing said potential of said first common node to be pulled toward said first supply potential when all of said wordlines of said first plurality of wordlines are non selected, said first decode means allowing said potential of said first common node to attain a potential different than said first supply potential when at least one of said first plurality of said wordlines is selected;

e) a second plurality of wordlines in electrical communication with the second portion of said array;

f) a second plurality of second driver circuits, each of said second driver circuits having an input node and an output node, each of said second driver circuits in electrical communication, at its output node with one of said wordlines of said second plurality of wordlines, the input nodes of said second driver circuits connected at a second common node, a potential on said second common node enabling said second plurality of driver circuits to drive a select potential to a selected wordline in said second plurality of wordlines and enabling said second plurality of driver circuits to drive a non select potential to non selected wordlines in said second plurality of wordlines when all of said wordlines of said second plurality of wordlines are non selected;

g) a second plurality of second serially connected transistors, each one of said second serially connected transistors connected, at a control input, to the output node of a corresponding one of said second driver circuits, said second plurality of second serially connected transistors interposed between said first supply node and the second common node; and h) a second decode means electrically interposed between said second supply node and said second common node, said second decode means allowing said potential of said second common node to be pulled toward said first supply potential when all of said wordlines in said second plurality of wordlines are non selected, said second decode means allowing said potential of said second common node to attain a potential different than said first supply potential when at least one of said wordlines in said second plurality of said wordlines is selected;

wherein each of said first and said second driver circuits comprises a first and a second decode input node, said first and said second decode input nodes of each of said first and said second driver circuits receiving complementary signals, one of said first and said second decode input nodes connectable to said first supply potential, wherein when said first decode means is activated one of said wordlines of said first plurality of wordlines is selected by said complimentary signals on its said first and said second decode input nodes, said complementary signals on said first and said second decode input nodes of remaining wordlines of said first plurality of wordlines determining that said remaining wordlines of said first plurality are non selected, wherein when said second decode means is activated one of said wordlines of said second plurality of wordlines is selected by said complimentary signals on its said first and said second decode input nodes, said complementary signals on said first and said second decode input nodes of remaining wordlines of said second plurality of wordlines determining that said remaining wordlines of said second plurality are non selected.

* * * * *